United States Patent
Suh

(12) United States Patent (10) Patent No.: US 7,545,192 B2
Suh (45) Date of Patent: *Jun. 9, 2009

(54) CLOCK STOP DETECTOR

(75) Inventor: Jungwon Suh, Apex, NC (US)

(73) Assignee: Infineon Technologies AG, Munich (DE)

( * ) Notice: Subject to any disclaimer, the term of this patent is extended or adjusted under 35 U.S.C. 154(b) by 178 days.

This patent is subject to a terminal disclaimer.

(21) Appl. No.: 11/504,923

(22) Filed: Aug. 16, 2006

(65) Prior Publication Data

US 2006/0274599 A1 Dec. 7, 2006

Related U.S. Application Data

(63) Continuation of application No. 10/804,840, filed on Mar. 19, 2004, now Pat. No. 7,142,478.

(51) Int. Cl.
*H03K 17/22* (2006.01)
*G11C 8/00* (2006.01)

(52) U.S. Cl. ............... 327/198; 365/233; 365/191; 327/26; 327/175

(58) Field of Classification Search .............. 365/233, 365/191; 327/198
See application file for complete search history.

(56) References Cited

U.S. PATENT DOCUMENTS

| | | |
|---|---|---|
| 4,230,958 A | 10/1980 | Boll et al. |
| 5,517,144 A | 5/1996 | Nakashima |
| 5,606,531 A | 2/1997 | Moroni et al. |
| 5,841,299 A | 11/1998 | De |
| 6,246,614 B1 | 6/2001 | Ooishi |
| 6,381,188 B1 | 4/2002 | Choi et al. |
| 6,552,578 B1 | 4/2003 | Cheung et al. |
| 6,649,476 B2 | 11/2003 | Forbes |
| 6,686,802 B2 | 2/2004 | Maeda |
| 2006/0052962 A1* | 3/2006 | Shipton et al. .............. 702/106 |

* cited by examiner

*Primary Examiner*—Vibol Tan
(74) *Attorney, Agent, or Firm*—Dicke, Billig & Czaja, PLLC

(57) ABSTRACT

A clock stop detector for a memory comprises a first switch that closes in response to a first logic level of a clock signal to charge a capacitor, a second switch that closes in response to a second logic level of the clock signal to discharge the capacitor, and a logic circuit that outputs a control signal based on an inverted clock signal and a charge on the capacitor.

29 Claims, 4 Drawing Sheets

US 7,545,192 B2

CLOCK STOP DETECTOR

CROSS-REFERENCE TO RELATED APPLICATIONS

This Patent Application is a Continuation of U.S. patent application Ser. No. 10/804,840, filed on Mar. 19, 2004, now U.S. Pat. No. 7,142,478 entitled "CLOCK STOP DETECTOR," and which is herein incorporated by reference.

BACKGROUND

One type of memory known in the art is low power synchronous dynamic random access memory (SDRAM), which is also known as mobile random access memory (Mobile-RAM). Mobile-RAM is a low power synchronous DRAM designed especially for mobile applications, such as cellular telephones, personal digital assistants (PDAs), handheld computers, etc. Mobile-RAMs achieve high speed transfer rates by employing a chip architecture that pre-fetches multiple bits and then synchronizes the output data to a system clock.

Reducing the power consumption of portable electronic devices and thereby increasing the battery life of those portable electronic devices continues to be an area of focus in the development of portable electronic devices. Typically, the power consumption of portable electronic devices, including the power consumption of the memory utilized by those portable electronic devices, is a design concern since battery life is an important feature of portable electronic devices. In many portable electronic devices, the memory consumes power even when the memory is not being accessed by the portable electronic device.

SUMMARY

One embodiment of the invention provides a clock stop detector for a memory. The clock stop detector comprises a first switch that closes in response to a first logic level of a clock signal to charge a capacitor, a second switch that closes in response to a second logic level of the clock signal to discharge the capacitor, and a logic circuit that outputs a control signal based on an inverted clock signal and a charge on the capacitor.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
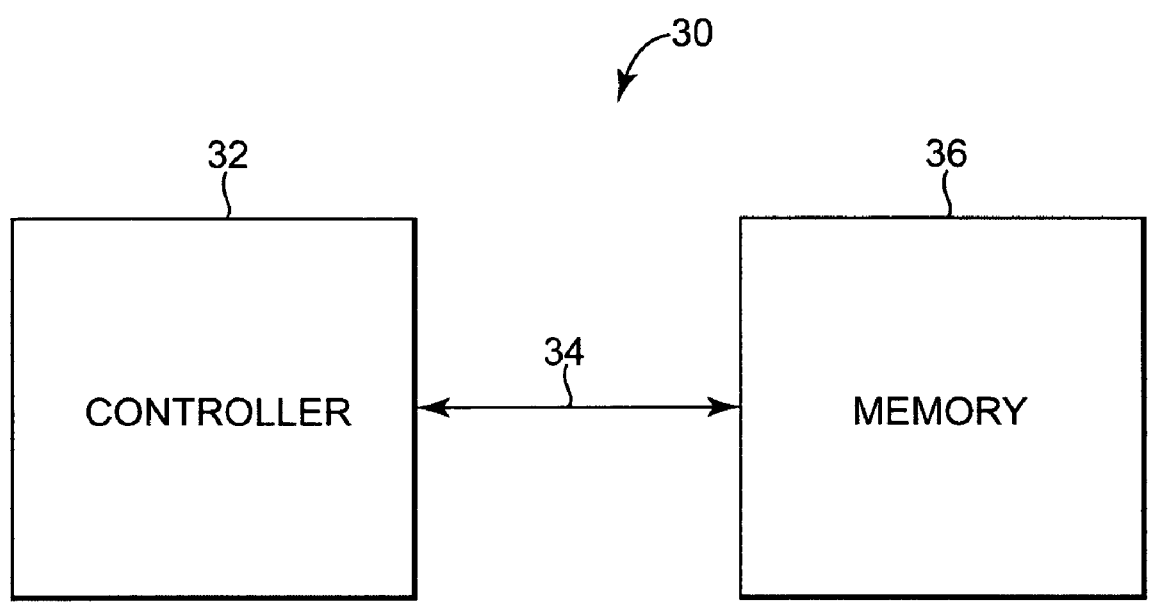
FIG. 1 is a block diagram illustrating one embodiment of a memory system.

FIG. 1 is a block diagram illustrating one embodiment of a memory system 30. Memory system 30 includes controller 32 and memory 36. Controller 32 is electrically coupled to memory 36 through communication link 34.

Controller 32 includes logic, firmware, and/or software for controlling the operation of memory 36. In one embodiment, controller 32 is a microprocessor or other suitable device capable of passing a clock signal, address signals, command signals, and data signals to memory 36 through communication link 34 for reading data from and writing data to memory 36. Controller 32 passes a clock signal, address signals, command signals, and data signals to memory 36 through communication link 34 to read data from and write data to memory 36. Controller 32 starts and stops the clock signal passed to memory 36 to activate and deactivate portions of memory 36, respectively. The clock is stopped to deactivate portions of memory 36 to conserve power when memory 36 is not being used.

Memory 36 includes circuits for communicating with controller 32 through communication link 34 and for reading and writing data in memory 36. Memory 36 includes a random access memory (RAM), such as a dynamic random access memory (DRAM), synchronous dynamic random access memory (SDRAM), double data rate synchronous dynamic random access memory (DDR SDRAM), low power synchronous dynamic random access memory (Mobile-RAM), or other suitable memory. Memory 36 responds to memory read requests from controller 32 and passes the requested data to controller 32. Memory 36 also responds to write requests from controller 32 and stores data in memory 36 passed from controller 32.

To conserve power, controller 32 deactivates portions of memory 36 not being used by stopping the clock signal sent to memory 36 through communication link 34. Memory 36 detects the stopped clock signal and deactivates portions of memory 36. Controller 32 activates portions of memory 36 to be used by starting the clock signal sent to memory 36 through communication link 34. Memory 36 detects the running clock signal and activates the previously deactivated portions of memory 36.

Figure 2:
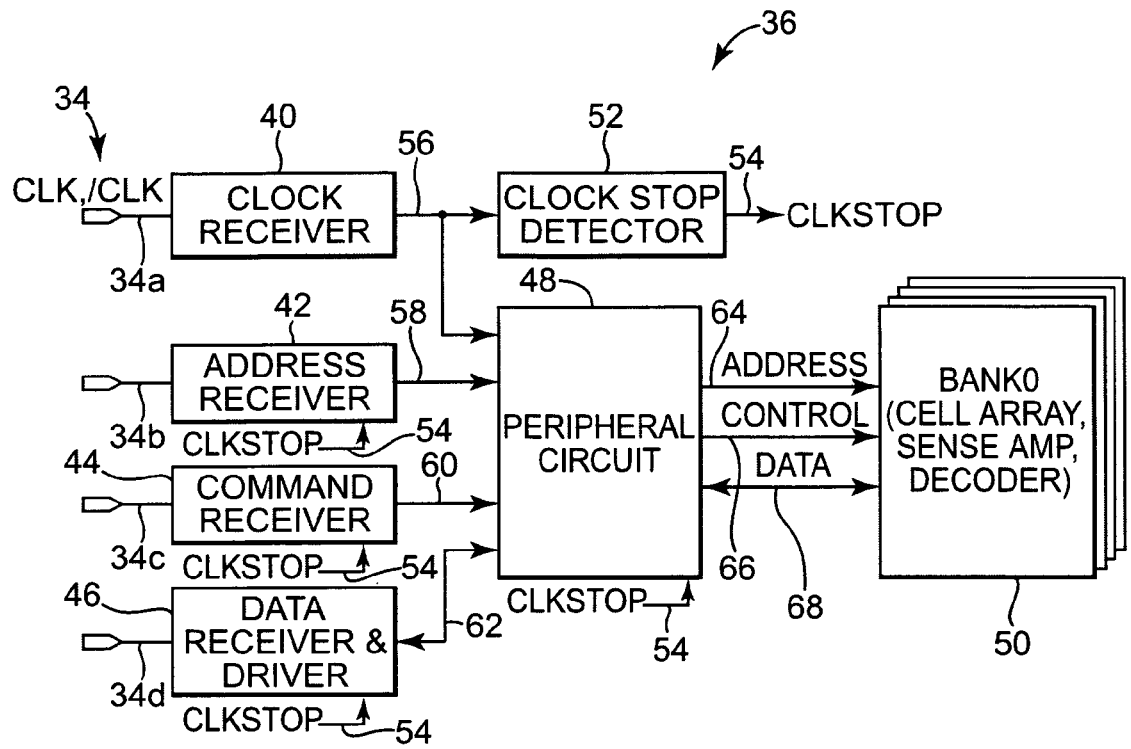
FIG. 2 is a block diagram illustrating one embodiment of a memory.

FIG. 2 is a block diagram illustrating one embodiment of memory 36. Memory 36 includes a clock receiver 40, an address receiver 42, a command receiver 44, a data receiver and driver 46, a clock stop detector 52, a peripheral circuit 48, and an array of memory banks 50.

Clock receiver 40 is electrically coupled to clock stop detector 52 and peripheral circuit 48 through signal path 56. Address receiver 42 is electrically coupled to peripheral circuit 48 through signal path 58. Command receiver 44 is electrically coupled to peripheral circuit 48 through signal path 60. Data receiver and driver 46 is electrically coupled to peripheral circuit 48 through signal path 62. Peripheral circuit 48 is electrically coupled to the array of memory banks 50 through address signal path 64, control signal path 66, and data signal path 68. Clock stop detector 52 is electrically coupled to address receiver 42, command receiver 44, data receiver and driver 46, and peripheral circuit 48, through clock stop (CLKSTOP) signal path 54.

Communication link 34 includes clock signal path 34a, address signal path 34b, command signal path 34c, and data signal path 34d. Clock signal path 34a is electrically coupled to clock receiver 40. Address signal path 34b is electrically coupled to address receiver 42. Command signal path 34c is electrically coupled to command receiver 44. Data signal path 34d is electrically coupled to data receiver and driver 46.

Clock receiver 40 receives a clock signal (CLK) and an inverted clock signal (/CLK) from controller 32 through signal path 34a. In response to the CLK signal and /CLK signal, clock receiver 40 outputs an internal clock signal (iCLK) and an inverted internal clock signal (/iCLK) to clock stop detector 52 and peripheral circuit 48 through signal path 56.

Clock stop detector 52 receives the iCLK signal and the /iCLK signal from clock receiver 40. If the iCLK signal is active, i.e. the iCLK signal continues to transition between a logic high level and a logic low level at a specified frequency, clock stop detector 52 outputs a logic low on CLKSTOP signal path 54. If the iCLK signal is not active, i.e. the iCLK signal remains at a logic high level or a logic low level, clock stop detector 52 outputs a logic high signal on CLKSTOP signal path 54.

Address receiver 42 receives addresses from controller 32 through address signal path 34b indicating the locations in the array of memory banks 50 into which data is to be stored or from which data is to be retrieved. Address receiver 42 also receives the CLKSTOP signal from clock stop detector 52 through CLKSTOP signal path 54. If the CLKSTOP signal is at a logic high level, address receiver 42 is deactivated to conserve power by powering down its circuits. If the CLKSTOP signal is at a logic low level, address receiver 42 is activated for operation by powering up its circuits.

Command receiver 44 receives read and write commands for the array of memory banks 50 from controller 32 through command signal path 34c. Command receiver 44 also receives the CLKSTOP signal from clock stop detector 52 through CLKSTOP signal path 54. If the CLKSTOP signal is at a logic high level, command receiver 44 is deactivated to conserve power by powering down its circuits. If the CLKSTOP signal is at a logic low level, command receiver 44 is activated for operation by powering up its circuits.

Data receiver and driver 46 receives data signals for writing to the array of memory banks 50 from controller 32 through signal path 34d. Data receiver and driver 46 also receives data for passing to controller 32 from the array of memory banks 50 through peripheral circuit 48. In addition, data receiver and driver 46 receives the CLKSTOP signal from clock stop detector 52 through CLKSTOP signal path 54. If the CLKSTOP signal is at a logic high level, data receiver and driver 46 is deactivated to conserve power by powering down its circuits. If the CLKSTOP signal is at a logic low level, data receiver and driver circuit 46 is activated for operation by powering up its circuits.

Peripheral circuit 48 receives the iCLK signal and /iCLK signal from clock receiver 40 through signal path 56, memory addresses from address receiver 42 through signal path 58, and memory read and memory write commands from command receiver 44 though signal path 60. Peripheral circuit 48 sends and receives data signals from data receiver and driver 46 through signal path 62. Peripheral circuit 48 sends and receives data from the array of memory banks 50 through data signal path 68, sends memory addresses to the array of memory banks 50 through address signal path 64, and sends control signals to the array of memory banks 50 through control signal path 66.

Peripheral circuit 48 performs read and write operations to the array of memory banks 50 through address signal path 64, control signal path 66, and data signal path 68. Peripheral circuit 48 also receives the CLKSTOP signal from clock stop detector 52 through CLKSTOP signal path 54. If the CLKSTOP signal is at a logic high level, peripheral circuit 48 is deactivated to conserve power by powering down its circuits. If the CLKSTOP signal is at a logic low level, peripheral circuit 48 is activated for operation by powering up its circuits.

The array of memory banks 50 includes arrays of memory cells, sense amplifiers and decoders for reading and writing data to the memory cells in the array of memory banks 50. Memory 36 can include RAM, DRAM, SDRAM, DDR SDRAM, Mobile-RAM, or other suitable memory.

Figure 3:
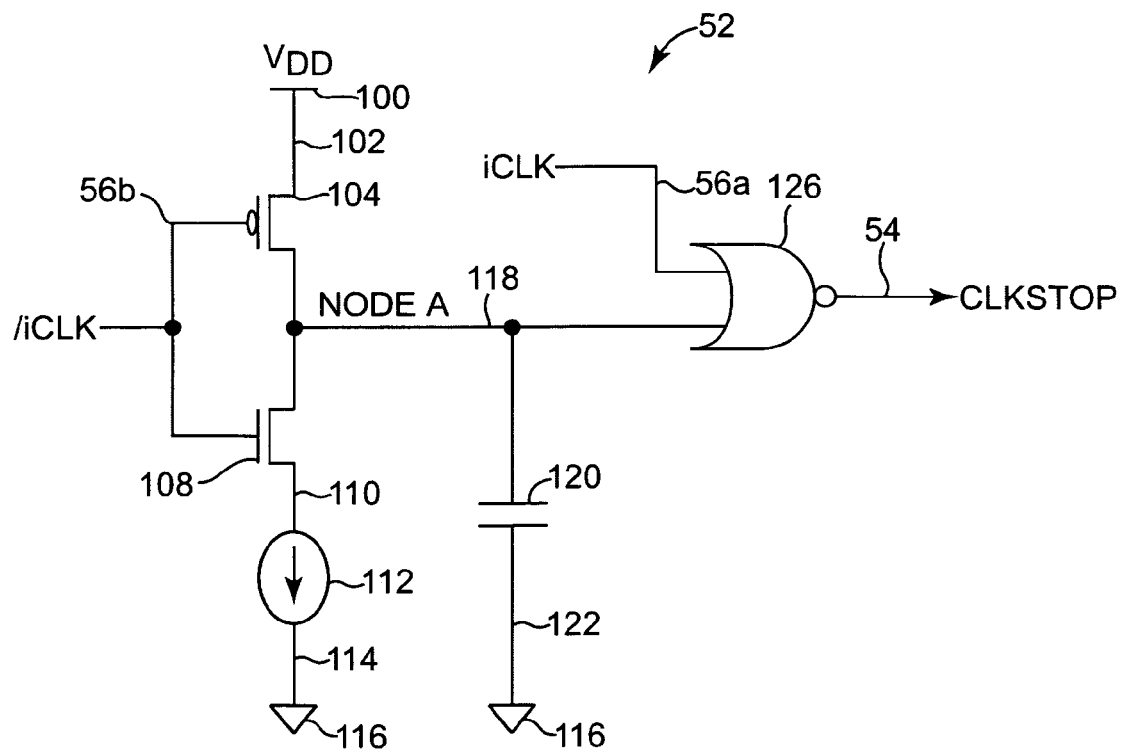
FIG. 3 is a schematic diagram illustrating one embodiment of a clock stop detector.

FIG. 3 is a schematic diagram illustrating one embodiment of clock stop detector 52. Clock stop detector 52 includes transistor 104, transistor 108, current source 112, capacitor 120, and NOR gate 126. Signal path 56 includes iCLK signal path 56a and /iCLK signal path 56b.

The /iCLK signal path 56b is electrically coupled to the active low gate of transistor 104 and the active high gate of transistor 108. One side of the source-drain path of transistor 104 is electrically coupled to a power supply voltage ($V_{DD}$) 100 through path 102 and the other side of the source-drain path of transistor 104 is electrically coupled to one side of the source-drain path of transistor 108, capacitor 120, and a first input of NOR gate 126 through Node A path 118. The other side of the source-drain path of transistor 108 is electrically coupled to current source 112 through path 110. Current source 112 is electrically coupled to a common or ground 116 through path 114. Capacitor 120 is electrically coupled to common or ground 116 through path 122. The iCLK signal path 56a is electrically coupled to a second input of NOR gate 126. The output of NOR gate 126 is electrically coupled to CLKSTOP signal path 54.

Transistor 104 is a p-type metal oxide semi-conductor field effect transistor (MOSFET) or other suitable transistor or switch. Transistor 108 is an n-type MOSFET or other suitable transistor or switch.

In operation, with the /iCLK signal at a logic low level, transistor 104 is turned on (conducting) and transistor 108 is turned off (not conducting). With transistor 104 turned on, $V_{DD}$ 100 charges capacitor 120 through path 102, transistor 104, and Node A path 118. With the /iCLK signal at a logic high level, transistor 108 is turned on (conducting) and transistor 104 is turned off (not conducting). With transistor 108 turned on, current source 112 discharges capacitor 120 through Node A path 118, transistor 108, and path 110. The rate of charging and discharging of capacitor 120 is adjusted based on the iCLK signal frequency and by selecting different values for capacitor 120 and current source 112. In one embodiment, capacitor 120 is charged in less than one cycle of the iCLK signal and discharged in more than one cycle of the iCLK signal.

NOR gate 126 outputs a logic high level on CLKSTOP signal path 54 if the iCLK signal on iCLK signal path 56a is at a logic low level and the signal on Node A path 118 is also at a logic low level. In all other cases, NOR gate 126 outputs a logic low level on CLKSTOP signal path 54. Therefore, a stopped clock is detected if the iCLK signal is at a logic low level and capacitor 120 discharges to the point where the signal on Node A transitions to a logic low level.

If the iCLK signal is active, capacitor 120 does not have enough time to discharge to the point where the signal on Node A path 118 transitions to a logic low level before capacitor 120 is charged again. The CLKSTOP signal on CLKSTOP signal path 54 remains at a logic low level. With the CLKSTOP signal at a logic low level, address receiver 42, command receiver 44, data receiver and driver 46, and peripheral circuit 48 are activated.

If the iCLK signal is not active, however, then capacitor 120 can discharge to the point where the signal on Node A path 118 transitions to a logic low level. With the iCLK signal also at a logic low level, the CLKSTOP signal on CLKSTOP signal path 54 transitions to a logic high level. With the CLKSTOP signal at a logic high level, address receiver 42, command receiver 44, data receiver and driver 46, and peripheral circuit 48 are deactivated.

Figure 4:
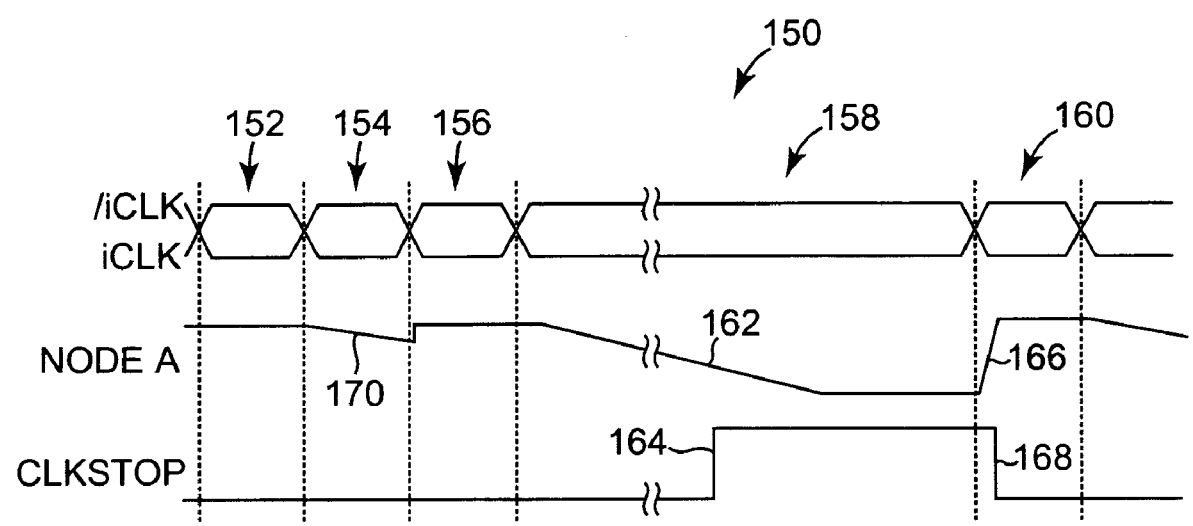
FIG. 4 is a timing diagram illustrating one embodiment of the timing of signals of the clock stop detector.

FIG. 4 is a timing diagram 150 illustrating one embodiment of the timing of signals of clock stop detector 52. Timing diagram 150 includes the /iCLK signal on /iCLK signal path 56b, the iCLK signal on iCLK signal path 56a, the Node A signal on Node A path 118, and the CLKSTOP signal on CLKSTOP signal path 54. Timing diagram 150 is divided into sections 152, 154, 156, 158, and 160.

In section 152, the iCLK signal is active and transitions to a logic high level and the /iCLK signal transitions to a logic low level. Transistor 108 is turned off and transistor 104 is turned on by the logic low level of the /iCLK signal. Capacitor 120 is charged, resulting in a logic high level on Node A. With the iCLK signal at a logic high level and the signal on node A at a logic high level, the CLKSTOP signal is at a logic low level.

In section 154, the iCLK signal remains active and transitions to a logic low level and the /iCLK signal transitions to a logic high level. Transistor 104 is turned off and transistor 108 is turned on by the logic high level of the /iCLK signal. Capacitor 120 begins to discharge, as indicated on the Node A signal at 170. However, capacitor 120 does not discharge to the point where the node A signal transitions to a logic low level. Therefore, the CLKSTOP signal remains at a logic low level.

In section 156, the iCLK signal remains active and returns to a logic high level and the /iCLK signal returns to a logic low level. Transistor 108 is turned off and transistor 104 is turned on by the logic low level of the /iCLK signal. Capacitor 120 is charged, resulting in a logic high level on Node A. With the iCLK signal at a logic high level and the signal on Node A at a logic high level, the CLKSTOP signal remains at a logic low level.

In section 158, the iCLK signal becomes inactive at a logic low level and the /iCLK becomes inactive at a logic high level. Transistor 104 is turned off and transistor 108 is turned on by the logic high level of the /iCLK signal. Capacitor 120 discharges as indicated by the Node A signal at 162. Capacitor 120 discharges to a point where the Node A signal transitions to a logic low level. At the point where the Node A signal transitions to a logic low level, the CLKSTOP signal transitions to a logic high level at 164. The CLKSTOP signal 164 remains at a logic high level as long as the iCLK signal is inactive.

In section 160, the iCLK signal returns to an active state. The iCLK signal transitions to a logic high level and the /iCLK signal transitions to a logic low level. Transistor 108 is turned off and transistor 104 is turned on by the logic low level of the /iCLK signal. Capacitor 120 is charged and the signal on Node A transitions to a logic high level at 166. With the iCLK signal at a logic high level and the signal on Node A at a logic high level, the CLKSTOP signal transitions to a logic low level at 168.

Figure 5:
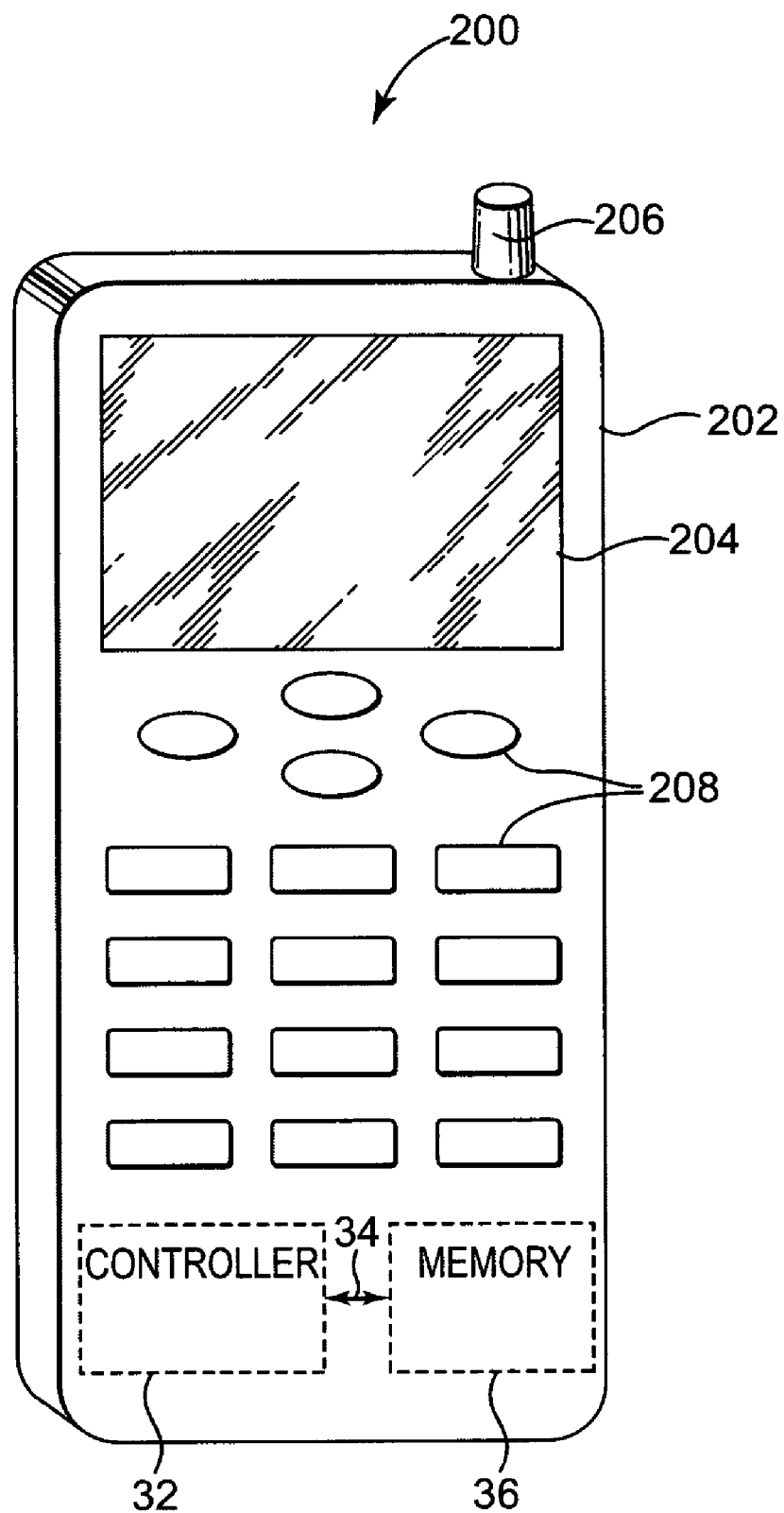
FIG. 5 is a diagram illustrating one embodiment of a cellular telephone including a memory system according to the present invention.

FIG. 5 is a diagram illustrating one embodiment of a cellular telephone including controller 32 and memory 36, according to the present invention. Cellular telephone 200 includes a housing 202, an antenna 206, a display 204, buttons 208, controller 32, and memory 36. Controller 32 is electrically coupled to memory 36 through communication link 34. In other embodiments, cellular telephone 200 can be any portable electronic device, such as a personal digital assistant (PDA), handheld computer, music player, digital camera, portable game system, etc.

Cellular telephone 200 receives user commands and data through buttons 208. Cellular telephone 200 stores data entered by a user and data used in the operation of cellular telephone 200 entered by other means, such as initial programming of cellular telephone 200 at the time of manufacture or through a computer or wireless interface, in memory 36.

Cellular telephone 200 conserves power and thereby extends its battery life by deactivating portions of memory 36 when those portions are not being used. In one embodiment, controller 32 is configured to output a clock signal to memory 36 that starts and stops in response to user commands, such as user commands that turn off the cellular phone or place the cellular phone in a low power mode. Clock stop detector 52 of memory 36 deactivates portions of memory 36 to conserve power if the clock signal is inactive and activates portions of memory 36 for operation if the clock signal is active.

What is claimed is:

1. A clock stop detector for a memory for detecting a clock signal being not active for a predetermined period of time, the clock stop detector comprising:
   a clock signal input;
   an inverted clock signal input;
   a first switch that is electrically coupled to the inverted clock signal input and closes in response to a first logic level of an inverted clock signal to charge a capacitor;
   a second switch that is electrically coupled to the inverted clock signal input and closes in response to a second logic level of the inverted clock signal to discharge the capacitor; and
   a logic circuit having a first input that is directly electrically coupled to the clock signal input and receives the clock signal and a second input that is electrically coupled to the capacitor and receives a charge signal based on a charge on the capacitor, and an output that outputs a control signal indicating when clock signal was not active for a period of time exceeding the predetermined period of time,
   wherein the capacitor is charged to the second logic level when the inverted clock signal is at the first logic level, and
   wherein the capacitor is discharged to the first logic level when the inverted clock signal is at the second logic level for a period of time exceeding the predetermined period of time.

2. The clock stop detector of claim 1, wherein the first switch comprises a first transistor and the second switch comprises a second transistor.

3. The clock stop detector of claim 2, wherein the first transistor is a p-type metal-oxide semiconductor field effect transistor and the second transistor is an n-type metal-oxide semiconductor field effect transistor.

4. The clock stop detector of claim 1, wherein the logic circuit comprises a NOR gate.

5. The clock stop detector of claim 1, wherein the first logic level is a logic low logic level and the second logic level is a logic high logic level.

6. The clock stop detector of claim 1, further comprising:
   a current source coupled to the second switch to discharge the capacitor if the second switch is closed.

7. The clock stop detector of claim 1, further comprising:
   a power supply voltage coupled to the first switch to charge the capacitor if the first switch is closed.

8. The clock stop detector of claim 1, wherein the second switch is open if the first switch is closed and the first switch is open if the second switch is closed.

9. A memory comprising:
   a clock stop detector for detecting a clock signal being not active for a predetermined period of time, the clock stop detector being configured to receive the clock signal and output a control signal in response to the clock signal; and a peripheral circuit for reading and writing data to a memory bank, wherein the peripheral circuit is configured to receive the control signal and activate and deactivate in response to the control signal, wherein the clock stop detector comprises:
- a clock signal input;
- an inverted clock signal input;
- a first switch that is electrically coupled to the inverted clock signal input and closes in response to a first logic level of an inverted clock signal to charge a capacitor;
- a second switch that is electrically coupled to the inverted clock signal input and closes in response to a second logic level of the inverted clock signal to discharge the capacitor; and
- a logic circuit having a first input that is directly electrically coupled to the clock signal input and receives the clock signal and a second input that is electrically coupled to the capacitor and receives a charge signal based on a charge on the capacitor, and an output that outputs a control signal indicating when clock signal was not active for a period of time exceeding the predetermined period of time,
- wherein the capacitor is charged to the second logic level when the inverted clock signal is at the first logic level, and
- wherein the capacitor is discharged to the first logic level when the inverted clock signal is at the second logic level for a period of time exceeding the predetermined period of time.

10. The memory of claim 9, further comprising:
a clock receiver configured to receive an external clock signal and pass the clock signal to the clock stop detector.

11. The memory of claim 9, further comprising:
an address receiver configured to receive the control signal and activate and deactivate in response to the control signal.

12. The memory of claim 9, further comprising:
a command receiver configured to receive the control signal and activate and deactivate in response to the control signal.

13. The memory of claim 9, further comprising:
a data receiver and driver configured to receive the control signal and activate and deactivate in response to the control signal.

14. The memory of claim 9, wherein the first switch comprises a first transistor and the second switch comprises a second transistor.

15. The memory of claim 9, wherein the memory comprises a random access memory.

16. The memory of claim 9, wherein the memory comprises a dynamic random access memory.

17. The memory of claim 9, wherein the memory comprises a double data rate synchronous dynamic random access memory.

18. The memory of claim 9, wherein the memory comprises a mobile random access memory.

19. A clock stop detector for a memory for detecting a clock signal being not active for a predetermined period of time, the clock stop detector comprising:
- a clock signal input;
- an inverted clock signal input;
- means for charging a capacitor in response to a first logic level of the inverted clock signal;
- means for discharging the capacitor in response to a second logic level of the inverted clock signal; and
- means for providing a control signal indicating when clock signal was not active for a period of time exceeding the predetermined period of time based on the clock signal and a charge on the capacitor, the means for providing a control signal having a first input that is directly electrically coupled to the clock signal input and receives the clock signal and a second input that is electrically coupled to the capacitor and receives a charge signal based on a charge on the capacitor,
- wherein the capacitor is charged to the second logic level when the inverted clock signal is at the first logic level, and
- wherein the capacitor is discharged to the first logic level when the inverted clock signal is at the second logic level for a period of time exceeding the predetermined period of time.

20. The clock stop detector of claim 19, further comprising:
means for providing the control signal to memory circuits to deactivate and activate the memory circuits in response to the control signal.

21. A method for detecting a stopped clock signal in a memory comprising:
- receiving a clock signal from a clock signal input and an inverted clock signal from an inverted clock signal input;
- charging a capacitor in response to a first logic level of the inverted clock signal;
- discharging the capacitor in response to a second logic level of the inverted clock signal; and
- detecting a stopped clock signal based on the clock signal and a charge on the capacitor,
- wherein the step of detecting a stopped clock signal comprises receiving the clock signal directly from the clock signal input and a charge signal based on the charge on the capacitor, and detecting the stopped clock signal based on the received clock signal and the charge signal based on the charge on the capacitor,
- wherein the capacitor is charged to the second logic level when the inverted clock signal is at the first logic level, and
- wherein the capacitor is discharged to the first logic level when the inverted clock signal is at the second logic level for a period of time exceeding the predetermined period of time.

22. The method of claim 21, wherein charging the capacitor comprises closing a first switch to supply a voltage to the capacitor.

23. The method of claim 22, wherein the first switch comprises a transistor.

24. The method of claim 21, wherein discharging the capacitor comprises closing a second switch to sink a current from the capacitor.

25. The method of claim 24, wherein the second switch comprises a transistor.

26. The method of claim 24, further comprising:
providing a control signal in response to detecting the stopped clock signal.

27. The method of claim 26, further comprising:
deactivating a memory circuit in response to the control signal.

28. A portable electronic device comprising:
a controller configured to output a clock signal that staffs and stops in response to user commands to a portable electronic device; and a memory that receives the clock signal, the memory comprising:
a clock stop detector configured to output a clock stop signal in response to the clock signal being not active for a predetermined period of time;
a peripheral circuit configured to receive the clock stop signal and activate and deactivate in response to the clock stop signal; and
a memory bank configured to receive address signals, control signals, and data signals from the peripheral circuit for reading and writing data in the memory bank,
wherein the clock stop detector comprises:
a clock signal input;
an inverted clock signal input;
a first switch that is electrically coupled to the inverted clock signal input and closes in response to a first logic level of an inverted clock signal to charge a capacitor;
a second switch that is electrically coupled to the inverted clock signal input and closes in response to a second logic level of the inverted clock signal to discharge the capacitor; and
a logic circuit having a first input that is directly electrically coupled to the clock signal input and receives the clock signal and a second input that is electrically coupled to the capacitor and receives a charge signal based on a charge on the capacitor, and an output that outputs a control signal indicating when clock signal was not active for a period of time exceeding the predetermined period of time,
wherein the capacitor is charged to the second logic level when the inverted clock signal is at the first logic level, and
wherein the capacitor is discharged to the first logic level when the inverted clock signal is at the second logic level for a period of time exceeding the predetermined period of time.

29. The portable electronic device of claim 28, wherein the portable electronic device comprises one of a cellular telephone, a personal digital assistant, a music player, a game system, a digital camera, and a computer.

* * * * *